US006983430B2

United States Patent
(12) United States Patent
Hegde et al.

(10) Patent No.: US 6,983,430 B2
(45) Date of Patent: Jan. 3, 2006

(54) METHOD OF RESOLVING MISMATCHED PARAMETERS IN COMPUTER-AIDED INTEGRATED CIRCUIT DESIGN

(75) Inventors: Shailesh U. Hegde, Cary, NC (US); Melvin T. Isom, III, Durham, NC (US)

(73) Assignee: Infineon Technologies AG, Munich (DE)

( * ) Notice: Subject to any disclaimer, the term of this patent is extended or adjusted under 35 U.S.C. 154(b) by 284 days.

(21) Appl. No.: 10/349,342

(22) Filed: Jan. 21, 2003

(65) Prior Publication Data

US 2004/0143808 A1 Jul. 22, 2004

(51) Int. Cl.
*G06F 17/50* (2006.01)
*G06F 9/455* (2006.01)

(52) U.S. Cl. .................... 716/2; 716/4; 716/11; 716/18

(58) Field of Classification Search ............... 716/1–18
See application file for complete search history.

(56) References Cited

U.S. PATENT DOCUMENTS 5,291,602 A * 3/1994 Barker et al. ............... 715/524
5,517,421 A * 5/1996 Jimbo et al. .................. 716/18
5,574,655 A * 11/1996 Knapp et al. ................. 716/17
5,625,565 A * 4/1997 Van Dyke ...................... 716/1
5,638,381 A * 6/1997 Cho et al. ................... 714/732
6,449,762 B1 * 9/2002 McElvain .................... 716/18
6,701,289 B1 * 3/2004 Garnett et al. ................ 703/14

OTHER PUBLICATIONS

R.C.Armstrong et al., "FICOM: A Framework for Incremental Consistency Maintenance in Multi-Representation, Structural VLSI Databases," 1992 IEEE, pp. 336-343.*

"*Introduction to Skill and Skill Programming—Training Manual Version 4.4.1*, " Cadence Design Systems, Inc., Apr. 11, 1997, pp. i-xviii, 1-2—17-26, A-1—C-13.

"*Introduction to Skill and Skill Programming —Lab Book Version 4.4.1*," Cadence Design Systems, Inc., Apr. 11, 1997, pp. i-xiii, 1-1—17-15, A-1—A-10.

"*Virtuoso Schematic Composer*," Cadence Design Systems, Inc. Datasheet (2003).

Levi et al., "*Down to the Wire—Requirements for Nanometer Design Implementation*," Cadence Design Systems, Inc. White Paper (2002).

"*Physical Design Retargeting*," Sagantec North America, Inc. [online] [retrieved on Apr. 4, 2003], retrieved from the Internet <URL: www.sagantec.com/html/physical.html>.

(Continued)

*Primary Examiner*—Leigh M. Garbowski
(74) *Attorney, Agent, or Firm*—Brinks Hofer Gilson & Lione

(57) ABSTRACT

A system and method for resolving mismatched parameters in computer-aided design of integrated circuits during schematic migration. The system compares the parameters within the circuit primitives of the target and source schematic databases and detects if the parameters are different. If so, the system alters the parameter in the target circuit primitive to resolve the mismatch.

17 Claims, 7 Drawing Sheets

OTHER PUBLICATIONS

"*Libraries & Silicon Infrastructure*," Sagantec North America, Inc. [online ] [retrieved on Apr. 3, 2003], retrieved from the Internet <URL: www.sagantec.com/html/library.html>.
"*SiClone—Accelerate Physical Implementation and Closure for Full Custom Design*," Sagantec North America, Inc. Datasheet (2000).
"*Hurricane—Re-Use and Optimize Your Existing, Silicon-Proven Intellectual Property*," Sagantec North America, Inc. Database (2000).
"*Companion—Accelerate Your Full Custom Layout Design by 2X-10X!*," Sagantec North America, Inc. Database (2000).
"*Perl 5.6 Documentation*," [online ] [retrieved on Apr. 4, 2003], retrieved from the Internet <URL: www.perldoc.com/perl5.6/pod/perl.html>.
"*Programming Languages-C++, Languages de programmation=C++*," America National Standard Institute, International Standard, ISO/IEC 14882, Jul. 27, 1998, pp. i-xxvi, 1-749.

* cited by examiner

METHOD OF RESOLVING MISMATCHED PARAMETERS IN COMPUTER-AIDED INTEGRATED CIRCUIT DESIGN

FIELD OF THE INVENTION

This invention relates to integrated circuit design. More particularly, the invention relates to a method of resolving mismatched parameters in computer-aided integrated circuit design.

BACKGROUND

Many integrated circuits are designed using computer-aided design ("CAD") programs running on a workstation. The designer typically selects electronic components for the integrated circuit through a graphical user interface ("GUI"), which includes a graphical display screen and a computer mouse or similar pointing device, familiar to those of ordinary skill in the art.

The electronic components are represented graphically by the CAD program on the graphical display screen. To position the electronic component within the part of the integrated circuit's schematic that is displayed on the screen, the designer "drags" the graphical symbol for the component to a position on the screen using the mouse. The designer "drops" the graphical symbol for the electronic component at the desired position on the screen and connects the graphical representation of the terminals of the electronic component to the terminals of other electronic components displayed on the screen. Connecting the graphical representation of the terminals in the GUI represents forming an electrical connection between the components on the designed integrated circuit.

Upon completing or editing the schematic for the part of the integrated circuit that is being designed, the designer may save the schematic as a circuit block. The circuit block consolidates the components in the schematic into a single entity for use within the CAD program. The designer assigns alphanumeric strings to the inputs and outputs of the circuit block for identifying the inputs/outputs, and also assigns an alphanumeric string to the circuit block as a name that identifies the circuit block. The circuit block may be added to a library of circuit blocks, catalogued by the assigned alphanumeric names, and represented as a circuit block on the GUI. Thereafter, the designer may connect the circuit blocks using the GUI in the same manner as with individual components by interconnecting the inputs and outputs of the circuit blocks.

Circuit blocks may be combined to form higher level circuit blocks resulting in a hierarchy of circuit blocks available to the designer. For example, an arithmetic processor circuit block may comprise at least one binary adder circuit block. The binary adder circuit block in turn may comprise multiple XOR logic gate components. The XOR logic gate components may comprise multiple NAND logic gate components, which in turn comprise multiple Complementary Metal Oxide Semiconductor ("CMOS") transistors. The designer typically stores the hierarchy of circuit blocks in a schematic database.

The CAD program may also create a graphical representation of the masks that are used in projection lithography to lay out the transistors and interconnections of the circuit blocks on a substrate for the integrated circuit. Alternatively the CAD program may control an electron-beam lithographic device to directly draw the masks on the integrated circuit substrate. The masks sequentially form layers of the semiconductor structures of the individual transistors on the substrate.

As manufacturing technology develops, a circuit designed originally in older technology may be reused as a circuit in the newer technology. Importing the schematic from one database to another saves designing the schematic from scratch in the new technology. For example, when designing an arithmetic processor for an integrated circuit that is to be built according to 140 nm CMOS technology, the designer may reuse the schematic for the processor from the schematic database for 170 nm CMOS technology. (The 140 nm and 170 nm refer to the minimum feature size on the respective technologies.) The schematic databases for 140 nm and 170 nm technology may differ in several ways, not the least of which is that the graphical representations of the masks for 140 nm technology typically include smaller semiconductor structures than the respective structures in 170 nm technology.

Moreover, some integrated circuits may include CMOS structures according to both technologies. For example, an integrated circuit may use 140 nm CMOS transistors in most circuit blocks, but use 170 nm CMOS transistors for components that are required to operate at a higher voltage than the 140 nm transistors. The schematics for such circuit blocks require distinguishable graphical symbols for the components of each structure size in order to clearly identify the 140 nm components and the 170 nm components. Therefore each structure size may have distinguishable graphical symbols and parameters associated with the symbols, such as the transistor gate thickness or the maximum drain-to-source voltage.

Transferring a design for an electronic circuit block from the schematic databases for one technology to the schematic database for another technology may lead to mismatches between the symbols and/or parameters. Additionally, different teams that are jointly developing the same design may use different schematic databases, leading to further mismatches when transferring designs between the schematic databases. The process of transferring designs between different schematic databases is termed "schematic migration" by those of ordinary skill in the art. Moreover, a schematic database may not contain a graphical symbol for a particular component, which hinders the effective transfer of a design to this schematic database if the design includes the particular component. Therefore there is a need for a method for resolving mismatched parameters in CAD programs during schematic migration.

SUMMARY

A method and system are described below to address the need for a system and method for resolving mismatched parameters in a computer-aided integrated circuit design system.

In accordance with one aspect of the invention, a method of resolving mismatched parameters in a computer-aided integrated circuit design system is provided that includes reading a source parameter of a source circuit primitive from a source schematic database, and reading a respective target parameter of a target circuit primitive from a target schematic database. The target circuit primitive corresponds to the source circuit primitive. The method includes automatically comparing the target parameter with the source parameter and altering the target circuit primitive if the source parameter and the target parameter are not identical.

Another aspect is a computer-aided integrated circuit design system. The system includes means for reading a source parameter of a source circuit primitive from a source schematic database, and means for reading a respective target parameter of a target circuit primitive from a target schematic database. The target circuit primitive corresponds to the source circuit primitive. The system also includes means for automatically comparing the target parameter with the source parameter and means for altering the target circuit primitive if the source parameter and the target parameter are not identical.

The foregoing and other features and advantages of preferred embodiments will be more readily apparent from the following detailed description, which proceeds with reference to the accompanying drawings.

DETAILED DESCRIPTION OF THE PRESENTLY PREFERRED EMBODIMENTS

Integrated circuits, due to their complexity, are typically designed using CAD tools, which are computer programs that allow the designer to build the schematic layout for the internal circuitry of the integrated circuit, simulate the electronic behavior of sections of the circuitry, and create photolithographic masks for constructing the circuits on the substrate of the integrated circuit. Examples of CAD tools include the Cadence tools manufactured by Cadence Design Systems, Inc. of San Jose, Calif., and those based on programming languages including the C++ programming language and the Practical Extraction and Reporting Language ("Perl"). Information on C++ may be found in the American National Standards Institute ("ANSI") standard ISO/IEC 14882, titled "Programming languages—C++," dated 1998, and information on Perl may be found at the Perl webpage. Perl home page [online]. O'Reilly, 1999 [retrieved on 2002-09-20]. Retrieved from the Internet: <URL: http:/www.perl.com>

Figure 1:
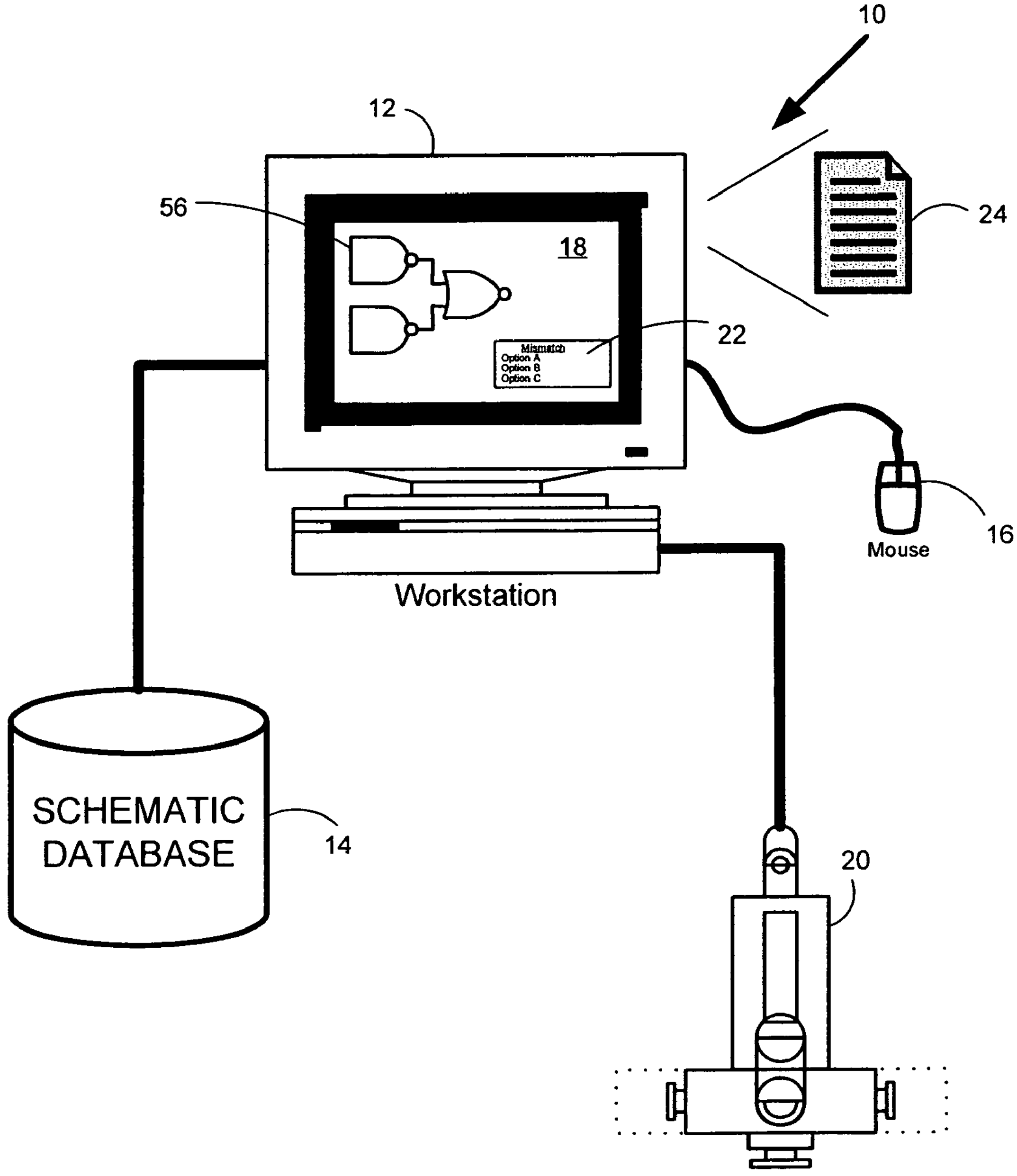
FIG. 1 is a block diagram illustrating a preferred configuration of a computer-aided integrated circuit design system.

FIG. 1 is a block diagram illustrating a preferred configuration of a computer-aided integrated circuit design system 10. The designer typically selects electronic components for the integrated circuit using a GUI running on a workstation 12. For example, the system 10 may include a computer workstation 12 manufactured by Silicon Graphics, Incorporated of Mountain View, Calif. A schematic database 14 is in communication with the workstation 12 and stores information on the graphical symbols for the electronic components of the design. In one embodiment, the GUI includes a graphical display screen 18 and a computer mouse 16, familiar to those of ordinary skill in the art. The workstation 12 is in communication with the mouse 16 or other graphical input device and interacts with the mouse 16 and display screen through a GUI program running on the workstation 12.

The designer uses the mouse 16 to select an electronic component from the schematic database 14. The designer drags and drops the graphical symbol for the electronic components at a desired position within a schematic that is displayed on a display screen 18 of the workstation 12. The designer connects the terminals of the selected electronic component to terminals of other components in the schematic with the mouse 16 by drawing lines between the graphical symbols displayed by the GUI on the workstation's 12 display screen 18.

The designer may also instruct the CAD system 10 to create a graphical representation of the masks that are used to layout the transistors and interconnections of the electronic circuit blocks on a substrate for the integrated circuit. The CAD system 10 retrieves a representation of the geometric structure of each semiconductor device corresponding to an electronic component from the schematic database and lays out the geometrical structures that correspond to the schematic on the integrated circuit's substrate. Further processing by the CAD system 10 and the workstation 12 produces the graphical representations of the masks that are used to sequentially build the geometric structures using the photolithographic processes that make the integrated circuit. The graphical representations of the masks may be displayed on the workstation 12 or output to a lithographic device 20 that either, as is familiar to those of ordinary skill in the art, draws the mask on a glass plate as in optical lithography, or draws the mask directly on the integrated circuit substrate as in electron-beam lithography.

An operating environment for the CAD system 10 includes a processing system with at least one Central Processing Unit ("CPU") and a memory system. Preferably, the at least one CPU controls the operations of the workstation 12. In accordance with the practices of persons skilled in the art of computer programming, the preferred methods are described herein with reference to acts and symbolic representations of operations that are performed by the processing system, unless indicated otherwise.

It will be appreciated that the acts and symbolically represented operations include the manipulation of electrical signals by the CPU. The electrical signals represent data bits that cause a resulting transformation or reduction of the electrical signal representation. The workstation 12 and other devices of the CAD system 10 may maintain data bits at memory locations in their respective memory systems to reconfigure or otherwise alter their CPU's operation, as well as other processing of signals, or maintain data bits on the schematic database 14. The memory locations, such as random access memory ("RAM") or the medium of the schematic database 14, are physical locations that have particular electrical, magnetic, or optical properties corresponding to the data bits, depending on the type of memory used. For example, the medium of the schematic database 14 may be a magnetic hard disc and/or a compact disc read only memory ("CD-ROM") having written thereon data structures and/or data files as is familiar to those of skill in the art.

The data bits may also be maintained on a computer readable medium including magnetic disks, optical disks, and any other volatile or non-volatile mass storage system readable by the CPU. The computer readable medium includes cooperating or interconnected computer readable media that exist exclusively on the CAD system 10 or are distributed among multiple interconnected processing systems that may be local to or remote to the CAD system 10.

Figure 2:
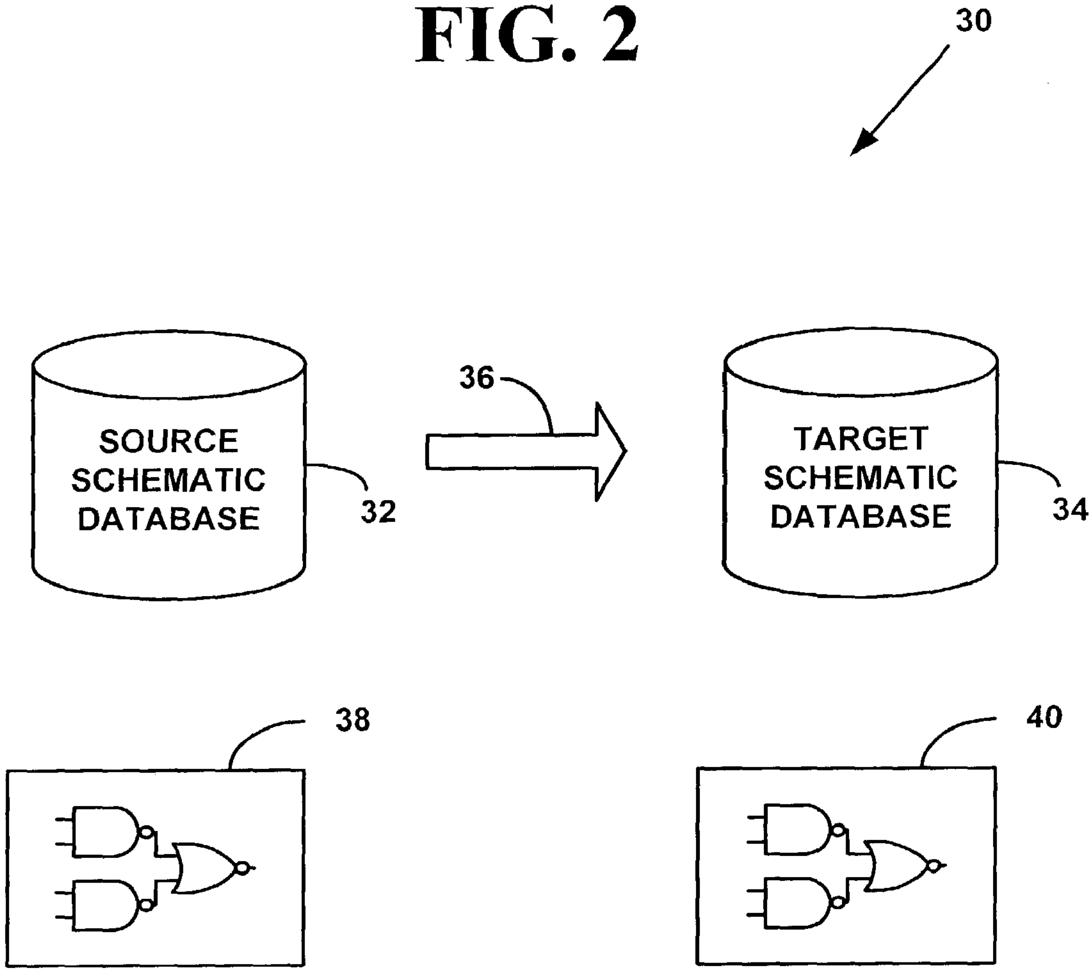
FIG. 2 is a block diagram illustrating a schematic migration from a source schematic database to a target schematic database in the computer-aided integrated circuit design system of FIG. 1.

FIG. 2 is a block diagram illustrating a schematic migration 30 from a source schematic database 32 to a target schematic database 34 in the computer-aided integrated circuit design system 10 of FIG. 1. The schematic databases 32, 34 include representations of electronic circuit blocks that are built out of circuit primitives. A circuit primitive represents a component of an electronic design with which the designer constructs a schematic 38, 40. Examples of circuit primitives include transistors, inverters, NAND logic gates, NOR logic gates, and flip-flops. Circuit primitives are stored in respective circuit primitive libraries in the schematic databases 32, 34. An entry for a circuit primitive in a circuit primitive library is stored as a data structure in the computer readable medium that hosts the schematic database 32, 34.

As is known to those of ordinary skill in the circuit design art, a designer may design an analog circuit according to a schematic comprising transistors, discrete components, operational amplifiers and other analog circuit primitives. Also the designer may design a digital circuit according to a schematic comprising logic gates. In the latter case, the circuit primitives are the basic logic gates. But there are a variety of transistor designs for, say, a NAND logic gate. Moreover, the NAND logic gate may be buffered to provide a better output signal when operating in conjunction with additional circuitry. The designer may thus select amongst a variety of circuit primitives that provide the common NAND logic function.

Also, the designer may design a specialized circuit that performs the NAND logic function from scratch as a circuit comprising the transistor circuit primitives. The designer may store the specialized circuit in its transistorized form in the schematic database 32, 34. Alternatively, the designer may define the specialized circuit to be a new circuit primitive for a NAND logic gate.

A circuit primitive data structure may include a graphical symbol for the schematic, parameters that describe the function of the circuit primitive to the CAD system 10, parameters that describe the geometric structure of the respective electronic component on the integrated circuit substrate, and parameters describing the electrical characteristics of the electronic circuit block or electronic component to the CAD system 10 for purposes of simulating the electrical behavior of the schematic. It should be understood that these parameters are for illustration only and do not limit the circuit primitive data structures and the schematic databases 32, 34 of CAD systems 10 to the parameters described above. For example, some CAD systems 10 permit the designer to create and associate additional parameters with the circuit primitive, which parameters are stored in the schematic database 32, 34 as part of an amended circuit primitive data structure.

In the source schematic database 32, a source schematic 38 includes source circuit primitives that are associated with the source schematic database 32, and interconnections among the source circuit primitives. In a preferred embodiment, the source schematic 38 is stored in the source schematic database 32 as separately identified entries for the source circuit primitives or electronic circuit blocks with identifiers for the terminals of each source circuit primitive or electronic circuit block. The source schematic database 32 also includes a list of which terminals are interconnected. For example, the source circuit primitives or electronic circuit blocks may be stored as nodes in a root-and-tree database structure, as is familiar to those of ordinary skill in the art, and the interconnections may be stored as links between the nodes.

The schematic migration process 36 converts the source schematic 38 comprising source circuit primitives into the target schematic 40 comprising target circuit primitives. For example, in the Cadence CAD system, the schematic migration process 36 is performed by a utility program that is written in the SKILL computer language developed by Cadence Design Systems, Inc. of San Jose, Calif. In the schematic migration process 36, the CAD system 10 attempts to associate every source circuit primitive with a corresponding target circuit primitive. The CAD system 10 also attempts to associate terminals for the target circuit primitive with respective terminals for the corresponding source circuit primitive. The CAD system 10 constructs the target schematic 40 by retaining the selection of circuit primitives and interconnections used in the source schematic 38 but substituting the target circuit primitives and terminals for the respective source circuit primitives and terminals. The CAD system 10 stores the constructed target schematic 40 in the target schematic database 34.

Associating Circuit Primitives

Figure 3:
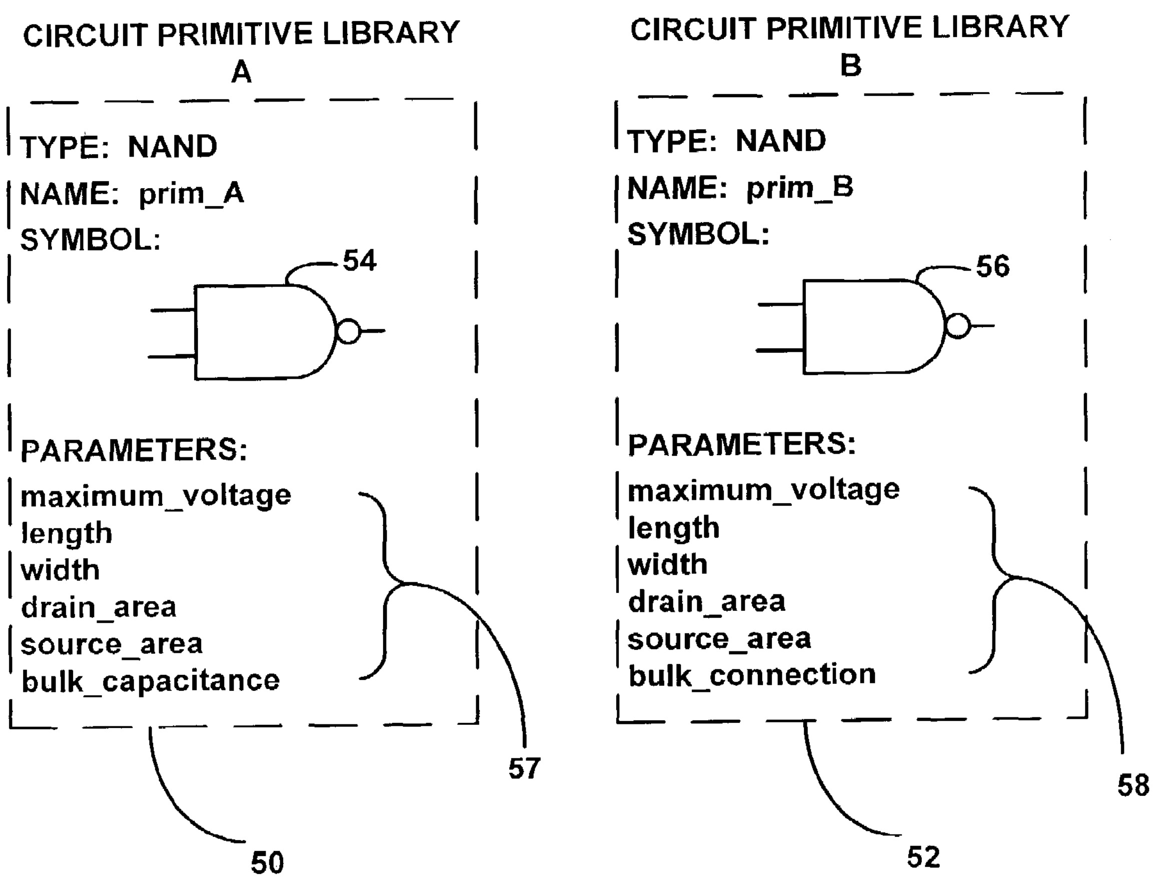
FIG. 3 is a block diagram illustrating an exemplary source circuit primitive and an exemplary target circuit primitive in the computer-aided integrated circuit design system of FIG. 1.

A step of the schematic migration process 36 is associating a target circuit primitive with a source circuit primitive. FIG. 3 is a block diagram illustrating an exemplary source circuit primitive 50 and an exemplary target circuit primitive 52 in the computer-aided integrated circuit design system 10 of FIG. 1. The source circuit primitive 50 may be stored as a data structure in the source circuit primitive library, which is part of the source schematic database 32. The target circuit primitive 52 may be stored as a data structure in the target circuit primitive library, which is part of the target schematic database 34. Each data structure comprises binary information for objects that are grouped together, the grouping represented here by the dotted lines of the circuit primitives 50, 52. Each data structure may group objects of varying types, such as a binary representation of a graphical symbol, numerical data, and text strings, or pointers to these objects.

The source schematic database 32 may be from an external vendor that sells its proprietary schematics to the designer. Alternatively, the source schematic database 32 may be from another design team that is cooperating on designing the integrated circuit, but whose schematic database 32 is different from the target schematic database 34 used by the designer. Additionally, as manufacturing technology develops, a source schematic 38 designed originally in older technology may be the basis for the target schematic 40 in the newer technology. For example, the designer may reuse the source schematic 38 from the source schematic database for 170 nm CMOS technology as a basis for target schematics 40 for 140 nm or 110 nm target technologies. The schematic databases for 170 nm, 140 nm, and 110 nm technologies may differ in several ways. For example, circuit primitives for 110 nm transistors may be associated with more parameters compared to 140 nm or 170 nm transistors because the behavior of 110 nm transistors is more sensitive to variations in parameters for doping, structure, and component separation on the integrated circuit.

The exemplary source circuit primitive 50 is the circuit primitive for a NAND logic gate from source circuit primitive library A. The data structure for the NAND logic gate is named as "prim_A" in the source circuit primitive library A. The data structure may include a graphical symbol 54 for the NAND logic gate and parameters that describe physical and/or electrical characteristics of the electronic component source corresponding to the source circuit primitive 50. When the CAD system 10 reads an occurrence of prim_A from the source schematic 38, the CAD system 10 draws the graphical symbol 54 for the NAND logic gate on the display 18 of the workstation 12 through the GUI. Additionally, the CAD system 10 may calculate the combined physical and/or electrical characteristics of a group of circuit primitives 50 in a schematic 38. The parameters 57 in the primitive 50 are the names of computer program variables that are used to calculate the combined characteristics of a schematic 38 as a function of the values of the variables.

Similarly, the exemplary target circuit primitive 52 is the circuit primitive for a NAND logic gate from target circuit primitive library B. The data structure for the NAND logic gate is named as "prim_B" in the target circuit primitive library B. The data structure may include a graphical symbol 56 for the NAND logic gate and parameters 58 for the electronic component associated with the circuit primitive 52.

During the schematic migration process 36, the CAD system 10 associates source circuit primitives 50 with corresponding target circuit primitives 52. The association may be performed by a utility program running on the CAD system 10. The source schematic 38 is converted to the target schematic 40 by replacing the source circuit primitives 50 with the target circuit primitives 52. For example, the CAD system 10 replaces occurrences of prim_A in the source schematic 38 with prim_B from the target circuit primitive library B.

Typically, the association of a particular source circuit primitive 50 with a corresponding target circuit primitive 52 is determined by whether the source 50 and target 52 primitives include the same character string for the type of circuit primitive. Alternatively, the schematic migration utility program consults a file where the name "prim_A" of the source circuit primitive library A in the source schematic database 32 has previously been associated with the name "prim_B" of the target circuit primitive library B in the target schematic database 34. Also as an alternative, the schematic migration utility program may associate the two circuit primitives 50, 52 that have the most number of parameters 57, 58 in common.

But the circuit primitive matching may fail because the parameters 57 for the source circuit primitive 50 may not be named identically to the parameters 58 for the corresponding target circuit primitive 52. For example, a parameter 57 named "bulk_capacitance" in the source circuit primitive 50 corresponds to a differently named parameter 58 "bulk_connection" in the target circuit primitive 52. If the CAD system 10 program for calculating combined physical and/or electrical characteristics is written in terms of the source circuit primitive 50 parameter 57 "bulk_capacitance," the program will not recognize the target circuit primitive 52 parameter after the schematic migration 36 process has substituted the source circuit primitive 50 by the target circuit primitive 52. In other words, there will not be a one-to-one correspondence of all objects in the data structures for the two circuit primitives 50, 52.

Figure 4:
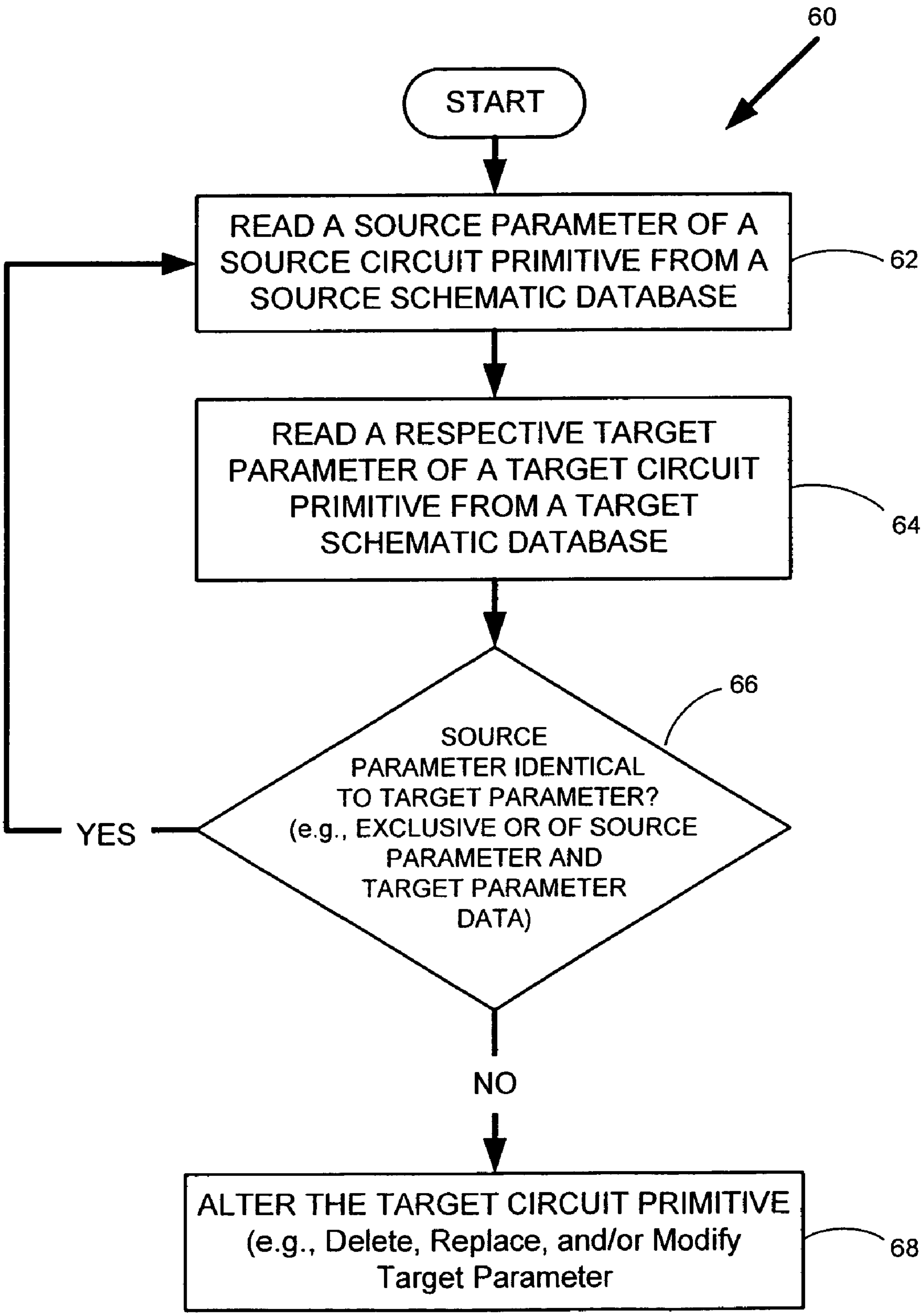
FIG. 4 is a flow diagram illustrating a preferred method of resolving mismatched parameters in the computer-aided integrated circuit design system of FIG. 1.

FIG. 4 is a flow diagram illustrating a preferred method 60 of resolving mismatched parameters 57, 58 in the computer-aided integrated circuit design system 10 of FIG. 1. The method 60 includes reading a source parameter 57 of a source circuit primitive 50 from a source schematic database 32 at step 62. At step 64, the CAD system 10 reads a respective target parameter 58 of a target circuit primitive 52 from a target schematic database 34. The target circuit primitive 52 corresponds to the source circuit primitive 50. At step 66, the CAD system 10 automatically compares the target parameter 58 with the source parameter 57. If the source parameter 57 and the target parameter 58 are not identical, the CAD system 10 alters the target circuit primitive 52 at step 68.

At step 62, the CAD system 10 reads the source parameter 57 of the source circuit primitive 50 from the source schematic database 32. The CAD system 10 may search the source schematic database 32, or the source primitive library therein, for the data structure corresponding to the source circuit primitive 50. The CAD system 10 finds an address in the memory for the data structure corresponding to the source circuit primitive 50 and loads the binary information corresponding to the data structure into RAM. From the data structure, the CAD system 10 extracts a character string corresponding to the source parameter 57.

Similarly, at step 64, the CAD system 10 reads the target parameter 58 of the target circuit primitive 52 from the target schematic database 34. The CAD system 10 may search the target schematic database 34, or the target primitive library therein, for the data structure corresponding to the target circuit primitive 52. The CAD system 10 finds an address in the memory for the data structure corresponding to the target circuit primitive 52 and loads the binary information corresponding to the data structure into RAM. From the data structure, the CAD system 10 extracts a character string corresponding to the target parameter 58.

The CAD system 10 automatically compares the character string corresponding to the source parameter 57 and the character string corresponding to the target parameter 58 at step 66 and determines whether the character strings are identical. The comparison may comprise XOR operations of the CPU between the binary representations of the two character strings. For example, with reference to FIG. 3, the CAD system 10 compares the source parameter 57 string "drain_area" from the data structure corresponding to the source circuit primitive 50 to the target parameter 58 string "drain_area" from the data structure corresponding to the target circuit primitive 52. The CAD system 10 in this case would determine that the source 57 and target 58 parameters are identical. Comparing the source parameter string "bulk_capacitance" from the data structure corresponding to the source circuit primitive 50 to the target parameter string "bulk_connection" from the data structure corresponding to the target circuit primitive 52 would result in a determination by the CAD system 10 that the source 57 and target 58 parameters are not identical.

Figure 5:
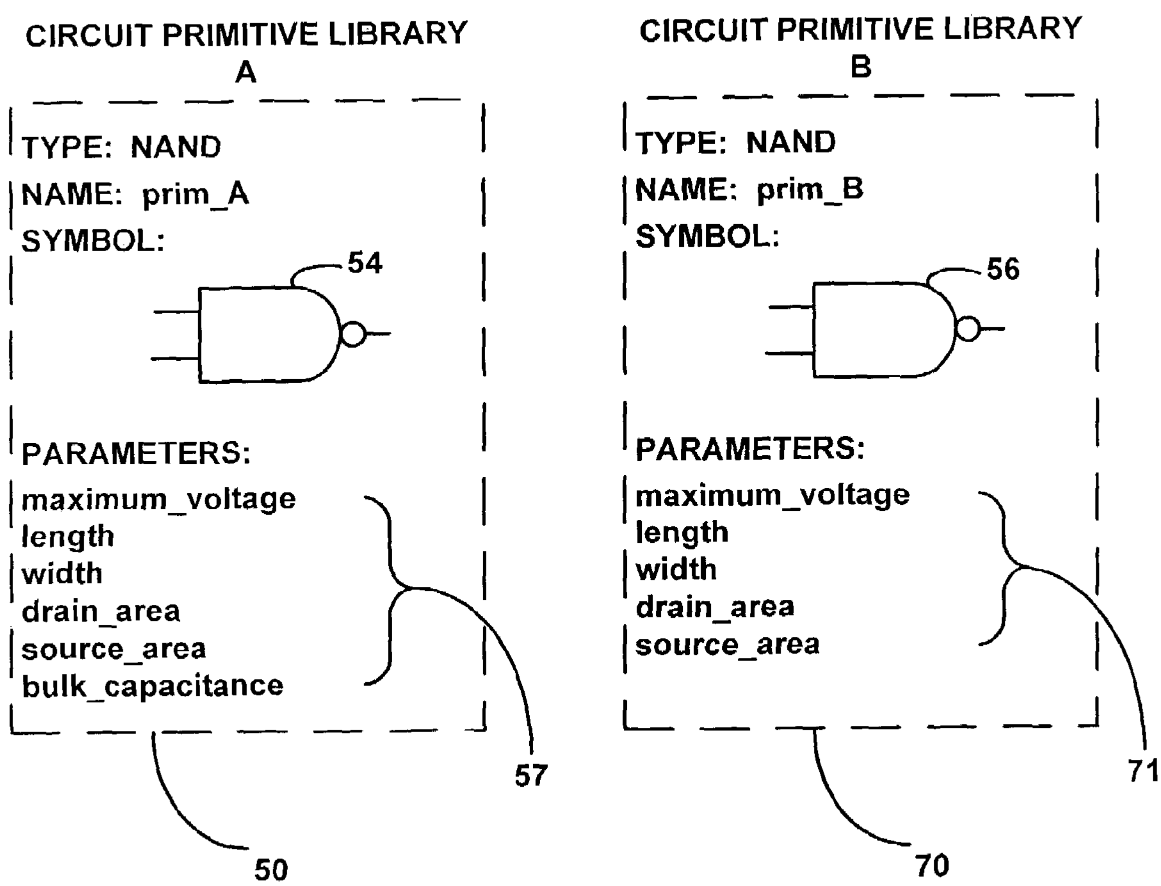
FIG. 5 is a block diagram illustrating an exemplary target circuit primitive with a deleted mismatched parameter in the computer-aided integrated circuit design system of FIG. 1.

If the source 57 and target 58 parameters are not identical, at step 68 the CAD system 10 alters the target circuit primitive 52. In one preferred embodiment, the CAD system 10 deletes the target parameter 58 from the target circuit primitive 52. Deleting the target parameter 58 from the target circuit primitive 52 removes the character string for the mismatched target parameter 58 from the data structure corresponding to the target circuit primitive 52. As a result, the target schematic 40 is a reproduction of the source schematic 38 but with each source circuit primitive 50 replaced by the corresponding target circuit primitive 52 less the mismatched target parameter 58. For example, FIG. 5 is a block diagram illustrating a target circuit primitive 70 in which the mismatched parameter 57 (bulk_connection) is removed. Consequently, the target parameters 71 of the target circuit primitive 70 lack the mismatched parameter 57, which is not available to CAD system 10 programs for calculating combined physical and/or electrical characteristics.

Figure 6:
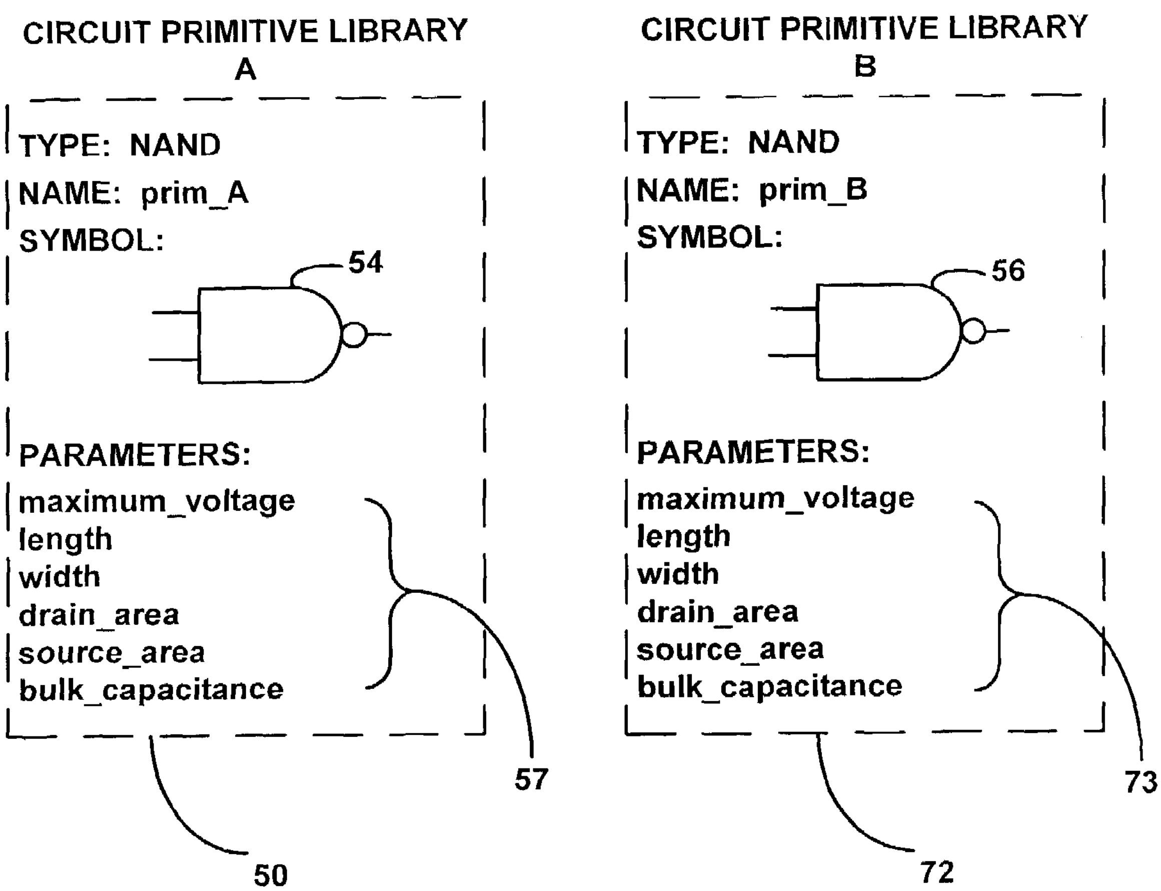
FIG. 6 is a block diagram illustrating an exemplary target circuit primitive with a replaced mismatched parameter in the computer-aided integrated circuit design system of FIG. 1.

In another preferred embodiment, the CAD system 10 replaces the target parameter 58 in the target circuit primitive 52 with the source parameter 57 from the source circuit primitive 50. As a result, the target schematic 40 is a reproduction of the source schematic 38 but with each source circuit primitive 50 replaced by the corresponding target circuit primitive 52, except that the mismatched target parameter 58 is replaced by the source parameter 57. For example, FIG. 6 is a block diagram illustrating a target circuit primitive 72 in which the mismatched parameter 58 (bulk_connection) is replaced by the source parameter 57 (bulk_capacitance). The target parameters 73 of the target circuit primitive 72 include the source parameter 57 corresponding to the mismatched parameter 58. Consequently, if the CAD system 10 programs for calculating combined physical and/or electrical characteristics are written in terms of the source parameter 57, the replaced target parameter 73 is available to the CAD system 10 for performing these calculations. The replaced target parameter 73 takes a value that was allocated to the original target parameter 58 when used to perform calculations.

Figure 7:
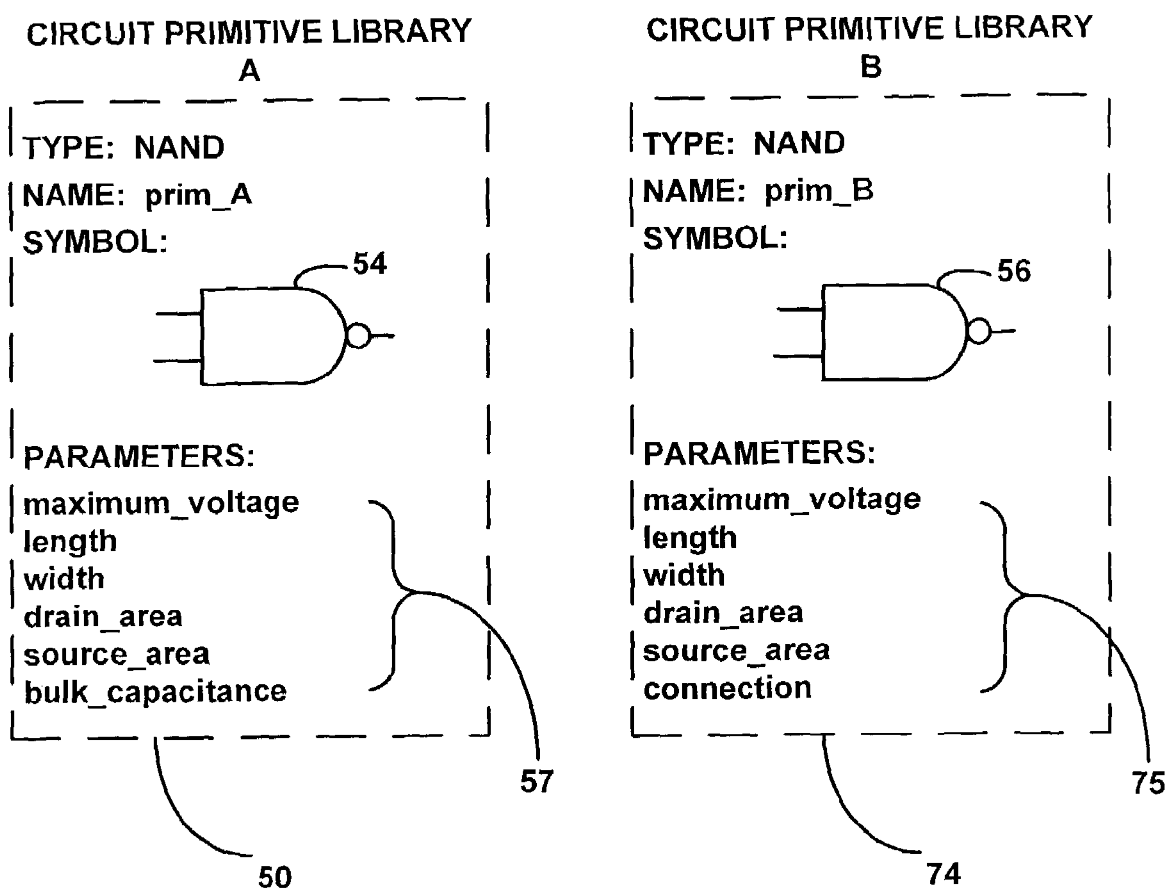
FIG. 7 is a block diagram illustrating an exemplary target circuit primitive with a modified mismatched parameter in the computer-aided integrated circuit design system of FIG. 1.

In yet another preferred embodiment, the CAD system 10 modifies the target parameter 58 in the target circuit primitive 52. As a result, the target schematic 40 is a reproduction of the source schematic 38 but with each source circuit primitive 50 replaced by the corresponding target circuit primitive 52, except that the mismatched target parameter 58 is replaced by the modified parameter. For example, FIG. 7 is a block diagram illustrating a target circuit primitive 74 in which the mismatched parameter 58 (bulk_connection) is modified to "connection" 75. Consequently, if the CAD system 10 programs for calculating combined physical and/or electrical characteristics are written in terms of the modified target parameter 75, the modified target parameter 75 is available to the CAD system 10 for performing these calculations. The modified target parameter 75 takes a value that was allocated to the original target parameter 58 when used to perform calculations.

The CAD system 10 may automatically alter the target parameter 75 of the designer may control the alteration through the GUI of the CAD system 10. In a preferred embodiment, when the CAD system 10 detects a mismatched parameter 58 during a schematic migration, such as at step 66 of FIG. 4, the CAD system 10 notifies the designer of the mismatch. As shown in FIG. 1, the notification may take the form of an alert on the display 18 of the workstation 12. Alternatively, the CAD system 10 presents an interactive dialogue 22 to the designer on the display screen 18 and receives instructions from the mouse 16 or other pointing device, the keyboard of the workstation 12, or through other input devices such as a touch sensitive screen incorporated into the workstation 12 display 18.

One embodiment of the interactive dialogue displays the mismatched source parameter 57 and target 58 to the designer. The interactive dialogue 22 prompts the designer to choose between a set of options presented to the designer on the display 18. For example, the options presented may include deleting the mismatched target parameter 71 from the target circuit primitive 70, replacing the mismatched target parameter 58 with the source parameter 73 in the target circuit primitive 72, or modifying the target parameter 75 in the target circuit primitive 74. It should be understood, however, that other options are possible, such as selecting a replacement target parameter from a third schematic database, and the present invention is not restricted to the preferred embodiments described above.

In response, the designer selects the desired option through the GUI of the CAD system 10 using the mouse 16 or other input device as described above. The GUI recognizes that the designer has selected the option, such as through a computer interrupt as is familiar to those in the art, and passes the result to the CAD system 10, which performs the selected option to result in an altered target circuit primitive 52. As described above, the altered target circuit primitive 52 may be a target circuit primitive 70 lacking the mismatched parameter 71, a target circuit primitive 72 including the source parameter 73, a target circuit primitive 74 including a modified parameter 75, or any other altered form of the target circuit primitive 52 depending on the selected alteration. Further, if the designer opts to modify the target parameter 75, the CAD system 10 may prompt the designer to enter a character string corresponding to the modified target parameter 75, or may present an interactive dialogue 22 through which the designer may edit the existing target parameter 58.

The target schematic 40 resulting from the schematic migration may include modified graphical symbols 56 for the target circuit primitives 52 that had mismatched parameters 58. In a preferred embodiment, as shown in FIG. 1 the graphical symbol 56 for a target circuit primitive 52 with a mismatched parameter 58 flashes when displayed on the display screen 18 of the workstation 12. In another preferred embodiment, the graphical symbol 56 flashes if the designer has not altered the mismatched target parameter 58, such as by deleting 71, replacing 73, or modifying 75 the target parameter as described above. It should be understood, however, that the modified graphical symbol 56 is not limited to the flashing graphical symbol described above and that other forms of the modified graphical symbol are possible, such as a differently colored graphical symbol of the same shape and appearance or a differently shaded graphical symbol of the same shape and appearance or a differently shaded graphical symbol of the same shape.

During the process of schematic migration, the method 60 of resolving mismatched parameters recognizes the mismatch and alters the parameters either automatically or in response to selections made by the designer through the GUI as described above. In a preferred embodiment, the CAD system 10 creates a log file 24 of actions taken during the method 60 of resolving mismatched parameters during the schematic migration process 36. For example, the CAD system 10 may create an ASCII file when the schematic migration utility is loaded into RAM and run on the CPU of the workstation 12. As the CAD system 10 identifies each source circuit primitive 50 in the source schematic database 32 and finds the associated target circuit primitive 52 in the target schematic database 34, the CAD system 10 performs the resolution method 60 described above. If the CAD system 10 detects mismatched parameters at step 66, the CAD system 10 writes the names of either or both primitives as a character string to the log file 24. The CAD system 10 may also write the names of either or both parameters to the log file 24. Further, if the CAD system 10 alters the target parameter, the CAD system 10 may also write the altered target parameter 75 to the log file 24 or a description of the action taken, such as a deletion 71, replacement 73, or modification 75 of the mismatched target parameter.

The foregoing detailed description is merely illustrative of several embodiments of the invention. Variations of the described embodiments may be encompassed within the purview of the claims. The steps of the flow diagrams may be taken in sequences other than those described, and more or fewer elements or components may be used in the block diagrams. Accordingly, any description of the embodiments in the specification should be used for general guidance, rather than to unduly restrict any broader descriptions of the elements in the following claims.

We claim:

1. A method of resolving mismatched parameters in a computer-aided integrated circuit design system, the method comprising:

(a) reading a source parameter of a source circuit primitive from a source schematic database;

(b) reading a respective target parameter of a target circuit primitive from a target schematic database, wherein the target circuit primitive corresponds to the source circuit primitive;

(c) automatically comparing the target parameter with the source parameter according to an exclusive OR logic operation on a character string corresponding to the source parameter and a character string corresponding to the target parameter; and (d) altering the target circuit primitive if the source parameter and the target parameter are not identical.

2. The method of claim 1, wherein (d) comprises:

deleting the target parameter from the target circuit primitive if the source parameter and the target parameter are not identical.

3. The method of claim 1, wherein (d) comprises:

replacing the target parameter of the target circuit primitive with the source parameter if the source parameter and the target parameter are not identical.

4. The method of claim 1, wherein (d) comprises:

modifying the target parameter in the target circuit primitive if the source parameter and the target parameter are not identical.

5. The method of claim 1, wherein (d) comprises:

(d1) displaying the source parameter and the target parameter on a user interface of the computer-aided integrated circuit design system;

(d2) presenting at least one option for resolving the target parameter on the user interface;

(d3) receiving a selected option from the at least one option on the user interface; and (d4) performing the selected option.

6. The method of claim 5 wherein the selected option comprises one of: deleting the target parameter, replacing the target parameter with the source parameter, and modifying the target parameter.

7. The method of claim 1 further comprising:

(e) displaying a modified target graphical symbol on a user interface of the computer-aided integrated circuit design system if the source parameter and the target parameter are not identical.

8. The method of claim 7 wherein the modified target graphical symbol is a flashing target graphical symbol.

9. The method of claim 1 further comprising:

(f) creating a log file of actions performed during steps (a), (b), (c) and (d).

10. A computer readable medium, having stored therein instructions for causing a processor to execute the steps of:

(a) reading a source parameter of a source circuit primitive from a source schematic database;

(b) reading a respective target parameter of a target circuit primitive from a target schematic database, wherein the target circuit primitive corresponds to the source circuit primitive;

(c) automatically comparing the target parameter with the source parameter according to an exclusive OR logic operation on a character string corresponding to the source parameter and a character string corresponding to the target parameter; and (d) altering the target circuit primitive if the source parameter and the target parameter are not identical.

11. A computer-aided integrated circuit design system comprising:

means for reading a source parameter of a source circuit primitive from a source schematic database;

means for reading a respective target parameter of a target circuit primitive from a target schematic database, wherein the target circuit primitive corresponds to the source circuit primitive;

means for automatically comparing the target parameter with the source parameter according to an exclusive OR logic operation on a character string corresponding to the source parameter and a character string corresponding to the target parameter; and means for altering the target circuit primitive if the source parameter and the target parameter are not identical.

12. The computer-aided integrated circuit design system of claim 11, wherein the means for altering comprises:

means for displaying the source parameter and the target parameter on a user interface of the computer-aided integrated circuit design system;

means for presenting at least one option for resolving the target parameter on the user interface;

means for receiving a selected option from the at least one option on the user interface; and means for performing the selected option.

13. A method of resolving mismatched parameters in a computer-aided integrated circuit design system, the method comprising:

(a) reading a source parameter of a source circuit primitive from a source schematic database;

(b) reading a respective target parameter of a target circuit primitive from a target schematic database, wherein the target circuit primitive corresponds to the source circuit primitive;

(c) automatically comparing the target parameter with the source parameter according to an exclusive OR logic operation on a character string corresponding to the source parameter and a character string corresponding to the target parameter;

(d) displaying the source parameter and the target parameter on a user interface of the computer-aided integrated circuit design system if the source parameter and the target parameter are not identical;

(e) presenting at least one option for resolving the target parameter on the user interface;

(f) receiving a selected option from the at least one option on the user interface; and (g) performing the selected option.

14. The method of claim 13 wherein the selected option comprises one of: deleting the target parameter, replacing the target parameter with the source parameter, and modifying the target parameter.

15. A method of resolving mismatched parameters in a computer-aided integrated circuit design system, the method comprising:

(a) reading a source parameter of a source circuit primitive from a source schematic database;

(b) reading a respective target parameter of a target circuit primitive from a target schematic database, wherein the target circuit primitive corresponds to the source circuit primitive;

(c) automatically comparing the target parameter with the source parameter; and (d) displaying a flashing target graphical symbol on a user interface of the computer-aided integrated circuit design system if the source parameter and the target parameter are not identical.

16. A computer readable medium, having stored therein instructions for causing a processor to execute the steps of:

(a) reading a source parameter of a source circuit primitive from a source schematic database;

(b) reading a respective target parameter of a target circuit primitive from a target schematic database, wherein the target circuit primitive corresponds to the source circuit primitive;

(c) automatically comparing the target parameter with the source parameter;

(d) altering the target circuit primitive if the source parameter and the target parameter are not identical; and (e) displaying a flashing target graphical symbol on a user interface if the source parameter and the target parameter are not identical.

17. A computer-aided integrated circuit design system comprising:

means for reading a source parameter of a source circuit primitive from a source schematic database;

means for reading a respective target parameter of a target circuit primitive from a target schematic database, wherein the target circuit primitive corresponds to the source circuit primitive;

means for automatically comparing the target parameter with the source parameter;

means for altering the target circuit primitive if the source parameter and the target parameter are not identical; and a means for displaying a flashing target graphical symbol on a user interface of the computer-aided integrated circuit design system if the source parameter and the target parameter are not identical.

* * * * *